(12) United States Patent
Uchiki et al.

(10) Patent No.: US 6,504,404 B2
(45) Date of Patent: Jan. 7, 2003

(54) SEMICONDUCTOR INTEGRATED CIRCUIT (75) Inventors: Hideki Uchiki, Tokyo (JP); Harufusa Kondoh, Tokyo (JP)

(73) Assignee: Mitsubishi Denki Kabushiki Kaisha, Chiyoda-ku (JP)

( * ) Notice: Subject to any disclaimer, the term of this patent is extended or adjusted under 35 U.S.C. 154(b) by 0 days.

(21) Appl. No.: 10/033,924

(22) Filed: Jan. 3, 2002

(65) Prior Publication Data

US 2002/0153943 A1 Oct. 24, 2002

(30) Foreign Application Priority Data

Apr. 18, 2001 (JP) .................................... 2001-119999

(51) Int. Cl.[7] ................................................ H03K 5/12
(52) U.S. Cl. ............................ 327/65; 327/77; 327/563
(58) Field of Search ............................. 327/52–55, 63, 327/65–67, 77, 87, 89, 560–563, 307, 362; 330/252, 253, 258

(56) References Cited

U.S. PATENT DOCUMENTS

| | | | | | |
|---|---|---|---|---|---|
| 5,440,253 | A | * | 8/1995 | Araya | 327/563 |
| 6,215,339 | B1 | * | 4/2001 | Hedberg | 327/65 |
| 6,329,849 | B1 | * | 12/2001 | Czarnul et al. | 327/103 |
| 6,339,355 | B1 | * | 1/2002 | Yamauchi et al. | 327/65 |
| 6,366,137 | B1 | * | 4/2002 | Garnier | 327/52 |

FOREIGN PATENT DOCUMENTS

| | | |
|---|---|---|
| JP | 8-507663 | 8/1996 |
| JP | 11-41081 | 2/1999 |

* cited by examiner

Primary Examiner—Toan Tran
(74) Attorney, Agent, or Firm—Burns, Doane, Swecker & Mathis, LLP (57) ABSTRACT A semiconductor integrated circuit includes a differential amplifier, a common level detection circuit which detects a common level of input signals A and B, and a bias generation circuit which generates a bias voltage to be applied to a gate terminal of a MOS transistor that is a constant-current power source of the differential amplifier based on the detected level.

15 Claims, 9 Drawing Sheets

TO BIAS GENERATION CIRCUIT 16
COMMON LEVEL VC

FIG.12

TO BIAS GENERATION CIRCUIT 16
COMMON LEVEL VC

FIG.13

SEMICONDUCTOR INTEGRATED CIRCUIT

FIELD OF THE INVENTION

The present invention relates to a semiconductor integrated circuit for amplifying input signals.

BACKGROUND OF THE INVENTION

Figure 1:
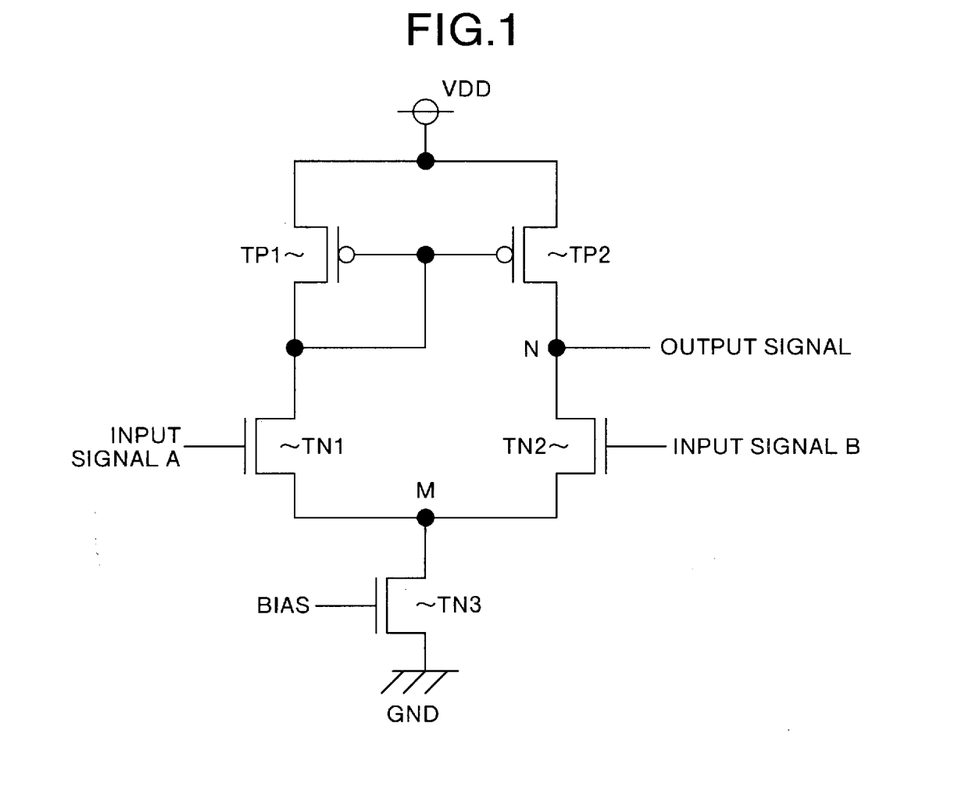
FIG. 1 is a circuit structure diagram showing a differential amplifier according to a conventional technique.

FIG. 1 shows a differential amplifier that has been well known conventionally. This differential amplifier includes p-channel type MOS ("pMOS") transistors TP1 and TP2, and n-channel type MOS ("nMOS") transistors TN1, TN2 and TN3.

The MOS transistor TP1 receives the power source voltage VDD from the source terminal, and the drain and the gate terminals are connected to each other. The MOS transistor TP2 receives the power source voltage VDD from the source terminal, the drain terminal is connected to the node N, and the gate terminal is connected to the gate terminal of the MOS transistor TP1. The MOS transistor TN1 has its drain terminal connected to the drain terminal of the MOS transistor TP1, and the source terminal connected to the node M. The MOS transistor TN2 has its drain terminal connected to the node N, and the source terminal connected to the node M. The MOS transistor TN3 receives the ground voltage GND (=0V<VDD) from the source terminal, and the drain terminal is connected in common to source terminals of the MOS transistors TN1 and TN2 respectively at the node M.

The MOS transistors TP1 and TP2 constitute a current mirror, and these MOS transistor function as loads on the MOS transistors TN1 and TN2 respectively. The differential amplifier receives input signals A and B from the gate terminals of the nMOS transistors TN1 and TN2 respectively, amplifies a differential voltage of these input signals, and outputs an amplified signal from the node N. The MOS transistor TN3 functions as a constant current source, and a fixed bias voltage is applied to the gate terminal of this MOS transistor TN3.

Figure 2:
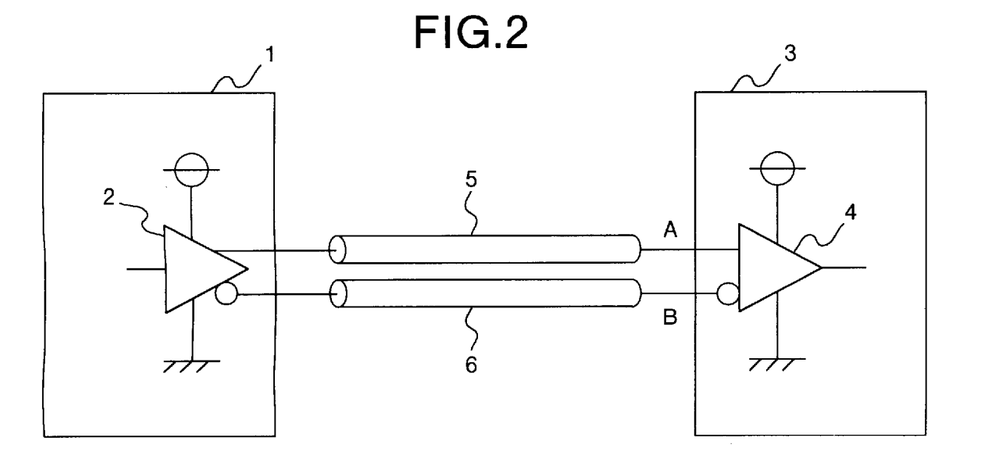
FIG. 2 is a diagram showing a structure for transferring a signal from one LSI to the other LSI according to a conventional technique.

This differential amplifier is also used as an input buffer. As shown in FIG. 2, the input buffer 4 is formed on a semiconductor ship 3 and the output buffer 2 is mounted on a separate semiconductor chip 1. The output buffer 2 outputs the signal A and the signal B that is the inverse signal of the signal A via the transmission paths 5 and 6 respectively. The input buffer 4 includes the differential amplifier shown in FIG. 1. The input buffer 4 supplies output signals to a main circuit formed within the same semiconductor chip 3. The signals A and B are applied to the gate electrodes of the MOS transistors TN1 and TN2 in the input buffer 4 respectively.

When the conventional differential amplifier is applied to the input buffer 4 shown in FIG. 2, a common level of an input signal that the input buffer 4 receives is different depending on the facing output buffer 2. The common level is a center level Vc between a maximum voltage VH0 and a minimum voltage VL0 of an amplitude of the input signal (Vc=(VH0+VL0)/2). Depending on the output buffer 2, the common level of the output signal may be 1.2 V, or larger than this, or smaller than this voltage, for example.

However, particularly when the common level becomes low for the input signal of the same amplitude, the voltage at the gate terminal versus the voltage at the source terminal of each of the MOS transistors TN1 and TN2 does not easily exceed the own threshold voltage. Therefore, the waveform of the output signal collapses, and the duty of the output signal versus the duty of the input signal changes, for example. Further, when the common level has lowered to an extent that the voltage at the gate terminal versus the voltage at the source terminal of each of the MOS transistors TN1 and TN2 does not completely exceed the own threshold voltage, the differential amplifier does not operate at all.

SUMMARY OF THE INVENTION

It is an object of the present invention to provide a semiconductor integrated circuit capable of outputting a signal of which level changes in response to an input signal even when the common level of the input signal has varied.

The semiconductor integrated circuit according to one aspect of the present invention comprises a differential amplifier including a first MOS transistor having a gate terminal connected to a first node, a second MOS transistor having a gate terminal connected to a second node, and a third MOS transistor having a drain terminal connected to source terminals of the first and second MOS transistors respectively. Furthermore, a level detector circuit is detects an intermediate voltage level between two voltages of the first and second nodes respectively, and a bias generation circuit generates a bias voltage to be applied to a gate electrode of the third MOS transistor based on a voltage level detected by the level detector circuit.

The semiconductor integrated circuit according to another aspect of the present invention comprises a differential amplifier including a first MOS transistor having a gate terminal connected to a first node, a second MOS transistor having a gate terminal connected to a second node, and a third MOS transistor having a drain terminal connected to source terminals of the first and second MOS transistors respectively. Furthermore, a first element is connected between the first node and a third node, a second element is connected between the second node and the third node. Furthermore, a bias generation circuit generates a bias voltage to be applied to a gate electrode of the third MOS transistor based on a voltage level of the third node.

Other objects and features of this invention will become apparent from the following description with reference to the accompanying. drawings.

DESCRIPTION OF THE PREFERRED EMBODIMENTS

Embodiments of the present invention will be explained below with reference to the accompanying drawings. In all the drawings, the same reference numbers and reference symbols have been provided to components that perform same of similar functions.

Figure 3:
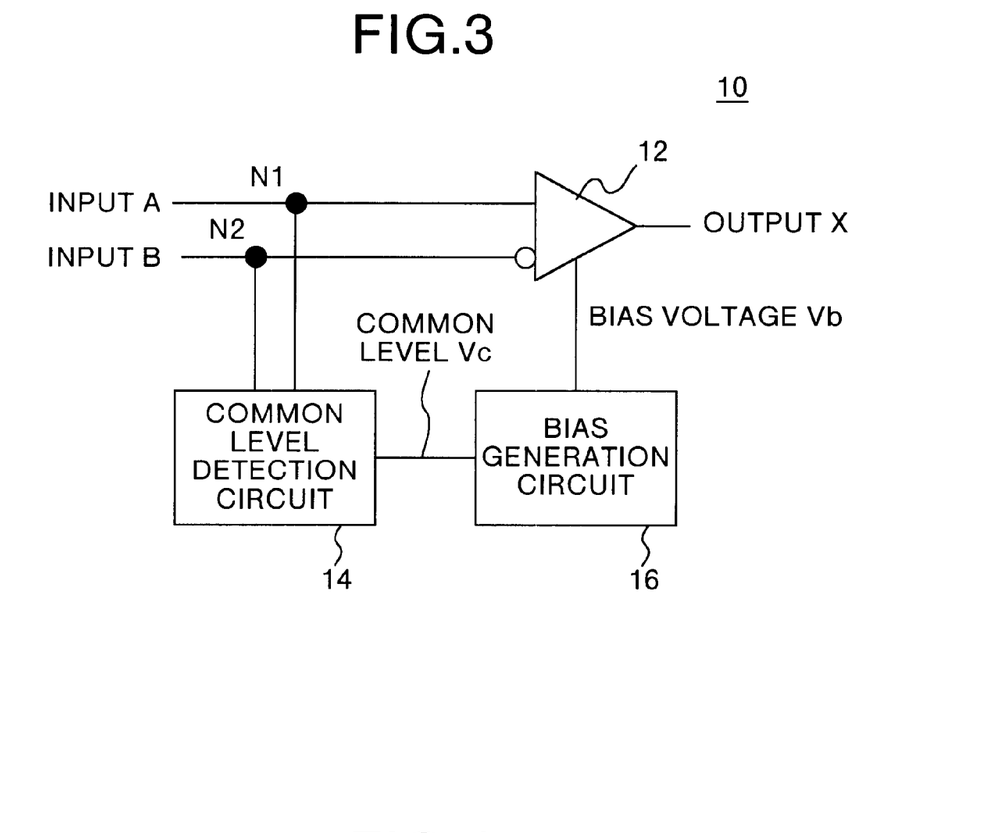
FIG. 3 is a block diagram showing a semiconductor integrated circuit (a differential amplifier) according to a first embodiment of the present invention.

FIG. 3 shows a structure of a semiconductor integrated circuit 10 according to a first embodiment. This semiconductor integrated circuit 10 is an amplifier circuit. The semiconductor integrated circuit 10 includes the differential amplifier 12 that amplifies a differential voltage between voltages of input signals A and B applied to nodes N1 and N2 respectively, the common level detection circuit 14 that detects an intermediate level of the voltages of the nodes N1 and N2, and the bias generation circuit 16 that generates a bias voltage to be applied to the differential amplifier 12 based on the detected common level. The differential amplifier 12 has the same structure as that of the differential amplifier shown in FIG. 1. Instead of a fixed voltage, a bias voltage generated by the bias generation circuit 16 is applied to a gate terminal of a MOS transistor TN3.

The input signals A and B are signals having mutually opposite logics. When the signal A is at a high level, the signal B is at a low level. When the signal A is at a low level, the signal B is at a high level. The high levels of the signals A and B are the same voltage levels VH, and the low levels of the signals A and B are the same voltage levels VL (VL<VH).

This semiconductor integrated circuit 10 is applied to the input buffer 4 shown in FIG. 2, and receives signals A and B propagating through transmission lines 5 and 6 as input signals.

Figure 4:
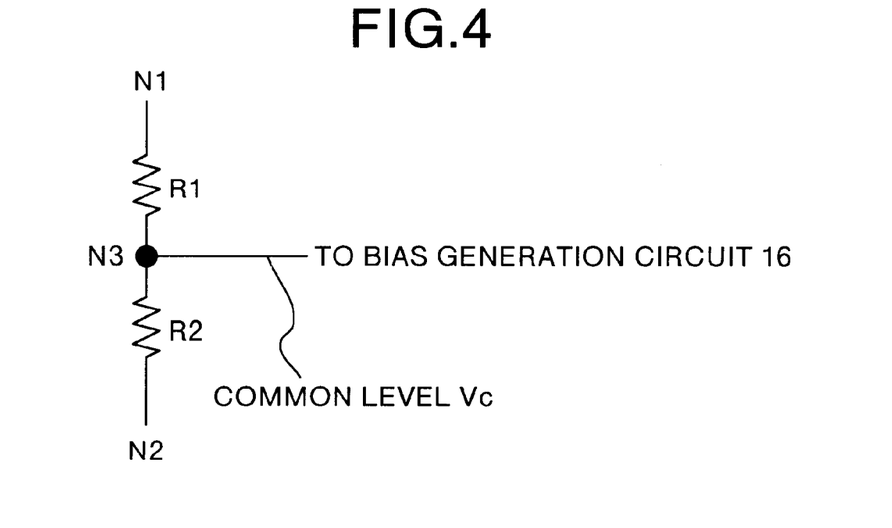
FIG. 4 is a circuit structure diagram showing a common level detection circuit 14 shown in FIG. 3.

FIG. 4 is a structure diagram showing one example of the common level detection circuit 14. The common level detection circuit 14 consists of a resistor R1 connected between nodes N1 and N3, and a resistor R2 connected between nodes N2 and N3. The voltage between the nodes N1 and N2 is divided by the resistors R1 and R2, and the divided voltage appears at the node N3.

The resistors R1 and R2 are assumed to have same resistances. Therefore, a common level (Vc=(VH+VL)/2) of the input signals A and B is always detected at the node N3.

The resistors R1 and R2 function as terminating resistors of the transmission lines 5 and 6 shown in FIG. 2 respectively. The resistors R1 and R2 can prevent a reflection of signals between the transmission lines and the circuit by matching the transmission lines 5 and 6 with the impedance (wiring resistance of the transmission lines).

Figure 5:
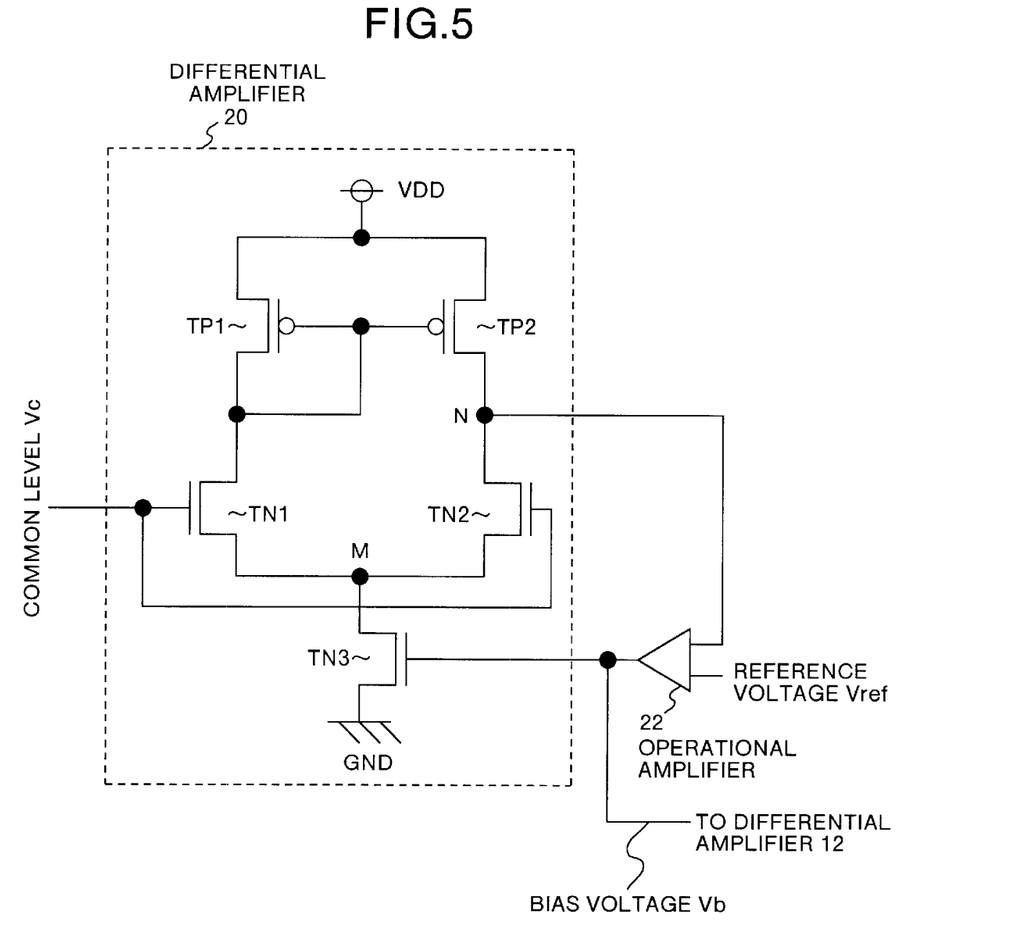
FIG. 5 is a circuit structure diagram showing a bias generation circuit 16 shown in FIG. 3.

FIG. 5 is a structure diagram showing one example of the bias generation circuit 16. The bias generation circuit 16 includes the differential amplifier 20 and an operational amplifier 22.

The differential amplifier 20 is a replica circuit of the differential amplifier 12, and it has the same configuration as the differential amplifier shown in FIG. 1. Gate terminals of MOS transistors TN1 and TN2 receive in common a common level Vc output from the common level detection circuit 14. The operational amplifier 22 receives a signal output from the node N in the differential amplifier 20, and a certain fixed reference voltage Vref, and outputs an amplified signal as a bias voltage Vb to be applied to the differential amplifier 12. The bias voltage Vb is also applied to the gate terminal of the MOS transistor TN3 in the differential amplifier 20.

In the bias generation circuit 16, the operational amplifier 22 generates a bias voltage Vb so that the voltage of the signal output from the differential amplifier 20 coincides with the reference voltage Vref. When the common level Vc rises, the ON resistances of the nMOS transistors TN1 and TN2 become smaller. Following this, when the gate voltage of the MOS transistor TN3 has been fixed, the voltage of the node N becomes lower.

However, the operational amplifier 22 lowers the bias voltage Vb to be applied to the gate terminal of the MOS transistor TN3 so as not to lower the voltage at the node N, and reduces the current that flows through the MOS transistor TN3 which is a constant-current source in the differential amplifier 20. As a result, the voltage of the node N is held at the reference voltage Vref. On the contrary, when the common level Vc becomes lower, the ON resistance of the nMOS transistors TN1 and TN2 become larger. However, the operational amplifier 22 increases the bias voltage Vb to be applied to the gate terminal of the MOS transistor TN3 so as to keep the voltage of the node N at the reference voltage Vref, and increases the current that flows through the constant-current source TN3.

In the differential amplifier 12, the gate terminal of the MOS transistor TN3 is applied with the bias voltage Vb generated by the bias generation circuit 16. Therefore, when the common level Vc of the input signals A and B becomes smaller, the current that flows through the constant-current source TN3 of the differential amplifier 12 increases, and the voltage of the node M becomes lower. As a result, the voltages of the gate terminals versus the source terminals of the nMOS transistors TN1 and TN2 are restricted from becoming lower than the own threshold voltages.

On the other hand, when the common level Vc of the input signals A and B becomes smaller, the current that flows through the MOS transistor TN3 which is the constant-current source in the differential amplifier 12 decreases, and the voltage of the node M increases. However, as the common level has also increased, the voltages of the gate terminals versus the source terminals of the nMOS transistors TN1 and TN2 do no become lower than the own threshold voltages.

In the differential amplifier 12, a signal having an amplitude almost same as the reference voltage Vref appears at the output node (node N). Therefore, it is possible to set the intermediate level of this output signal to a desired value by adjusting the reference voltage Vref.

As explained above, the current flowing through the transistor that becomes the constant-current source is adjusted according to a variation in the common level of the input signals A and B. Therefore, the differential amplifier 12 can output a signal of which signal level changes in response to the input signals A and B even when the common level has varied.

Figure 6:
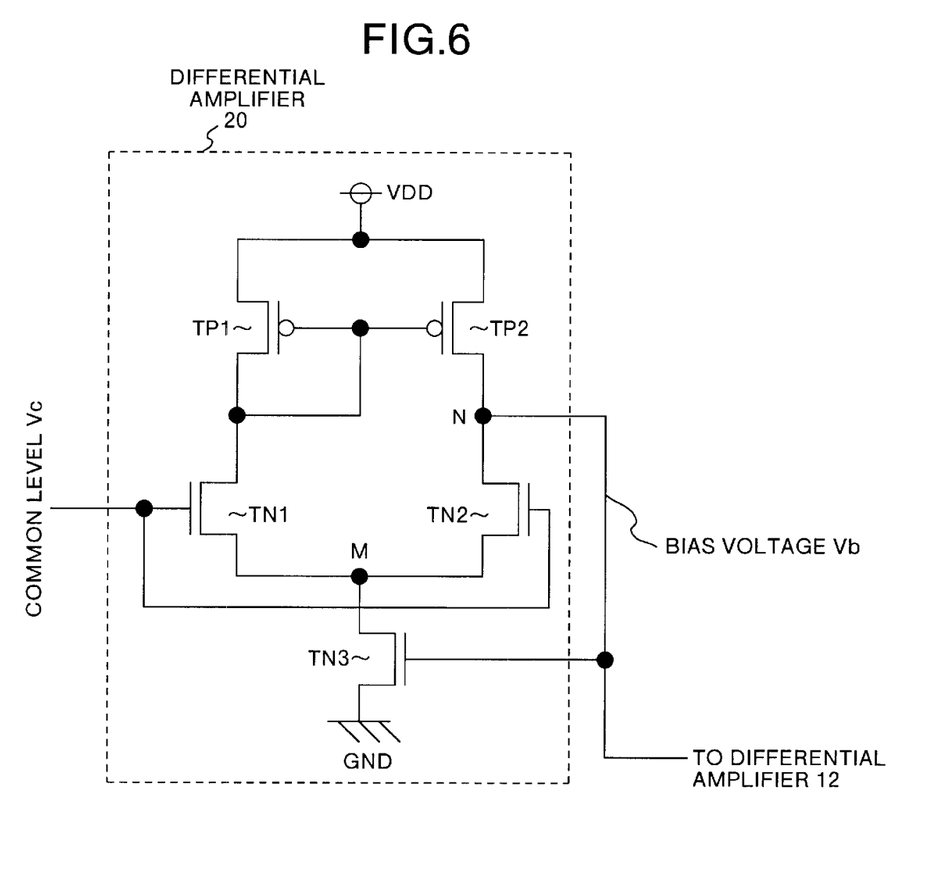
FIG. 6 is a circuit structure diagram showing a bias generation circuit 16 according to a second embodiment of the present invention.

FIG. 6 is a structure diagram showing another example of the bias generation circuit 16 as a second embodiment of the present invention. The configuration is almost the same as that shown in FIG. 5, with the differences that the operational amplifier 22 is excluded, and the output of the differential amplifier 20 is commonly applied straight as a bias voltage Vb to the gate terminal of the MOS transistor TN3 in the differential amplifier 20 as well as to the gate terminal of the MOS transistor TN3 in the differential amplifier 12.

Accordingly, an increase in the common level Vc works to lower the voltage of the node N. However, as the voltage of the node N is applied as the bias voltage Vb to the gate terminal of the MOS transistor TN3 (in the differential amplifier 20), even when the common level Vc increases, the current flowing through the MOS transistor TN3 decreases, and suppresses a reduction in the voltage of the node N on the contrary.

A reduction in the common level Vc works to increase the voltage of the node N. However, when the bias voltage Vb increases, the current flowing through the MOS transistor TN3 increases. Therefore, the bias voltage Vb suppresses an increase in the voltage of the node N on the contrary.

On the other hand, in the differential amplifier 12, when the common level of the input signals A and B becomes smaller, the current flowing through the MOS transistor TN3 which is a constant-current source in the differential amplifier 12 increases, and the voltage of the node M decreases. Therefore, the voltages of the gate terminals versus the source terminal of the nMOS transistors TN1 and TN2 are restricted from becoming lower than the own threshold voltages. On the contrary, when the common level of the input signals A and B becomes larger, the current flowing through the MOS transistor TN3 which is a constant-current source in the differential amplifier 12 increases, and the voltage of the node M increases. However, as the common level has also increased, the voltages of the gate terminals versus the source terminals of the nMOS transistors TN1 and TN2 do not become lower than the own threshold voltages.

Consequently, the current flowing through the transistor that becomes the constant-current source is adjusted according to a variation in the common level of the input signals A and B. Therefore, the differential amplifier 12 can output a signal of which signal level changes in response to the input signals A and B even when the common level has varied.

Further, in the second embodiment, it is possible to reduce the scale of the circuit by omission of the operational amplifier 22.

Figure 7:
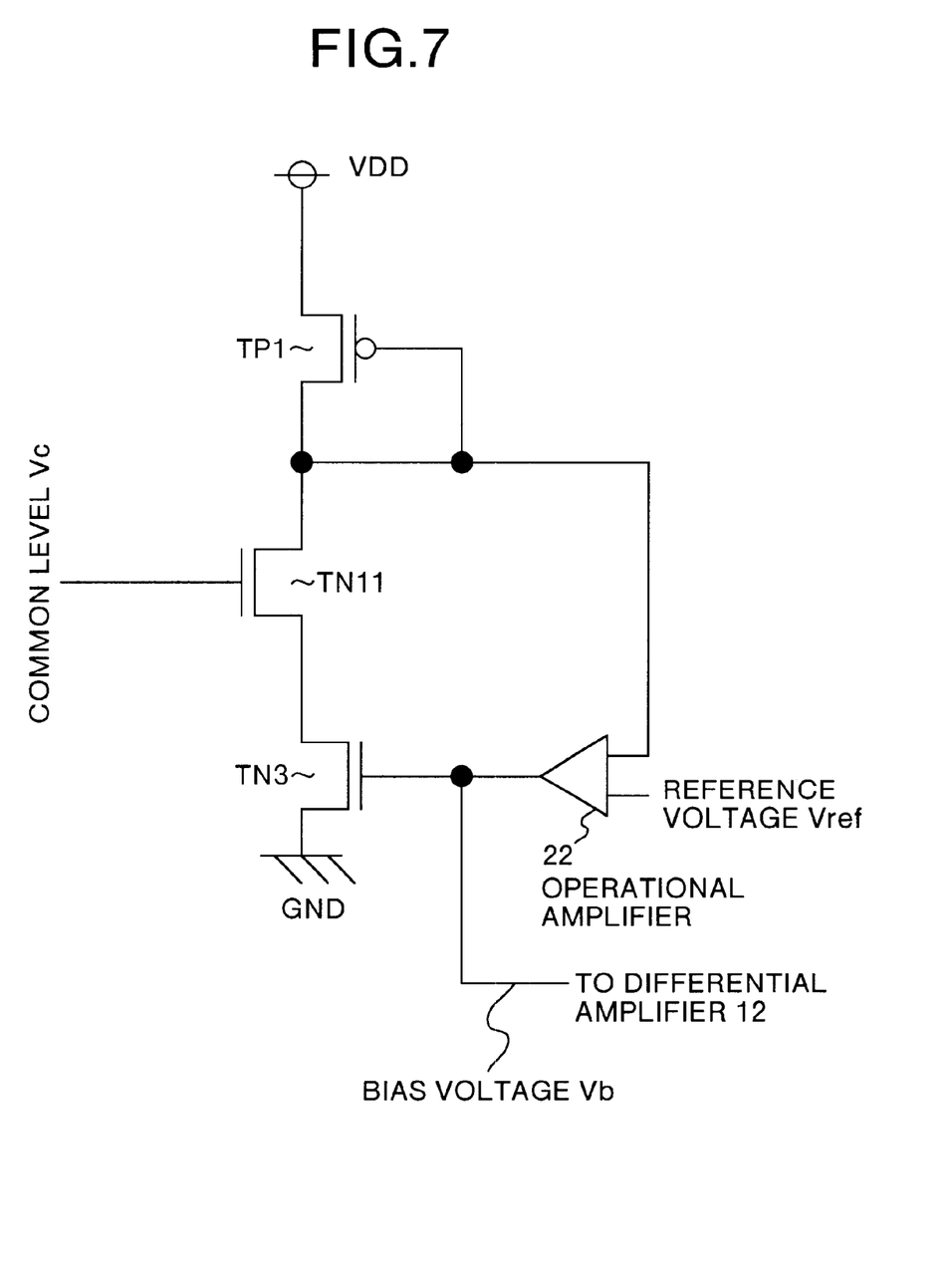
FIG. 7 is a circuit structure diagram showing a bias generation circuit 16 according to a third embodiment of the present invention.

FIG. 7 is a structure diagram showing still another example of the bias generation circuit 16 as a third embodiment of the present invention. The configuration is almost same as that shown in FIG. 6 with the differences that the MOS transistors TP2 and TN2 are excluded, the voltage of the drain terminal of the MOS transistor TP1 is applied to the operational amplifier, and the MOS transistor TN11 is provided. The MOS transistor TN11 has a transistor size (=gate width/gate length) that is half of that of the MOS transistor TP2 shown in FIG. 6.

The bias generation circuit 16 of the third embodiment performs operation similar to that of the bias generation circuit shown in FIG. 5. When a common level Vc varies, a bias voltage Vb changes so as to keep the voltage of a drain terminal of the MOS transistor TP1 at a reference voltage Vref. When the common level Vc increases, the bias voltage Vb becomes lower, and when the common level Vc becomes lower, the bias voltage Vb increases. Furthermore, this bias generation circuit 16 has a smaller circuit scale as compared to the bias generation circuit shown in FIG. 6. Moreover, current flowing through the MOS transistor TN3 is less. Therefore, it is possible to reduce power consumption.

Figure 8:
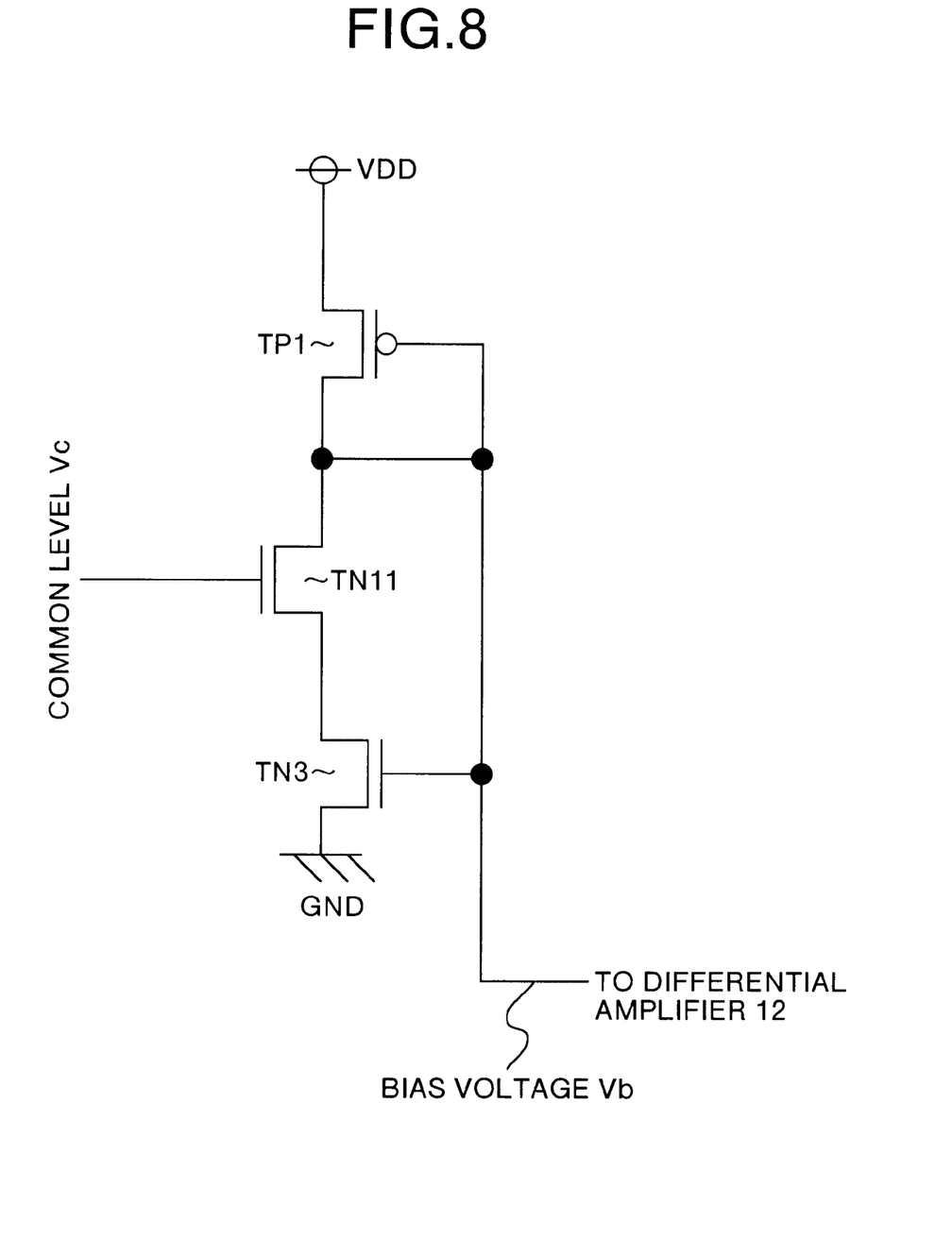
FIG. 8 is a circuit structure diagram showing a bias generation circuit 16 according to a fourth embodiment of the present invention.

FIG. 8 is a structure diagram showing still another example of a bias generation circuit 16 as a fourth embodiment of the present invention. The configuration is almost same as that shown in FIG. 6 with the differences that the MOS transistors TP2 and TN2 are excluded, the voltage of the drain terminal of the MOS transistor TP1 is applied to the gate terminal of the MOS transistor TN3, and the MOS transistor TN11 is provided. The MOS transistor TN11 has a transistor size that is half of that of the MOS transistor TP2 shown in FIG. 6.

The bias generation circuit of the fourth embodiment performs operation similar to that of the bias generation circuit shown in FIG. 6. When a common level Vc varies, a bias voltage Vb changes so as to suppress a variation in the voltage of a drain terminal of the MOS transistor TP1. When the common level Vc increases, the bias voltage Vb becomes lower, and when the common level Vc becomes lower, the bias voltage Vb increases. Furthermore, this bias generation circuit 16 has a smaller circuit scale as compared to the bias generation circuit shown in FIG. 6. Moreover, current flowing through the MOS transistor TN3 is less. Therefore, it is possible to reduce power consumption.

Figure 9:
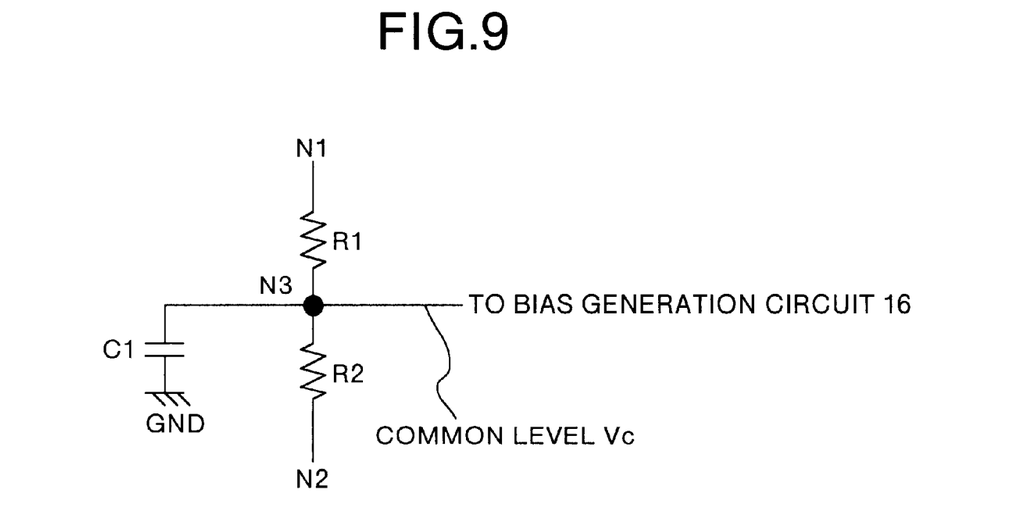
FIG. 9 is a circuit structure diagram showing a common level detection circuit 14 according to a fifth embodiment of the present invention.

FIG. 9 is a structure diagram showing another example of the common level detection circuit 14 as a fifth embodiment of the present invention. The configuration is the same as the common level detection circuit shown in FIG. 4 with the difference that there is provided the capacitor C1 having one terminal connected to the node N3 and the other terminal connected to the ground voltage GND.

The capacitor C1 prevents a common level detected by the common level detection circuit 14 from fluctuating due to noise included in input signals A and B.

Figure 10:
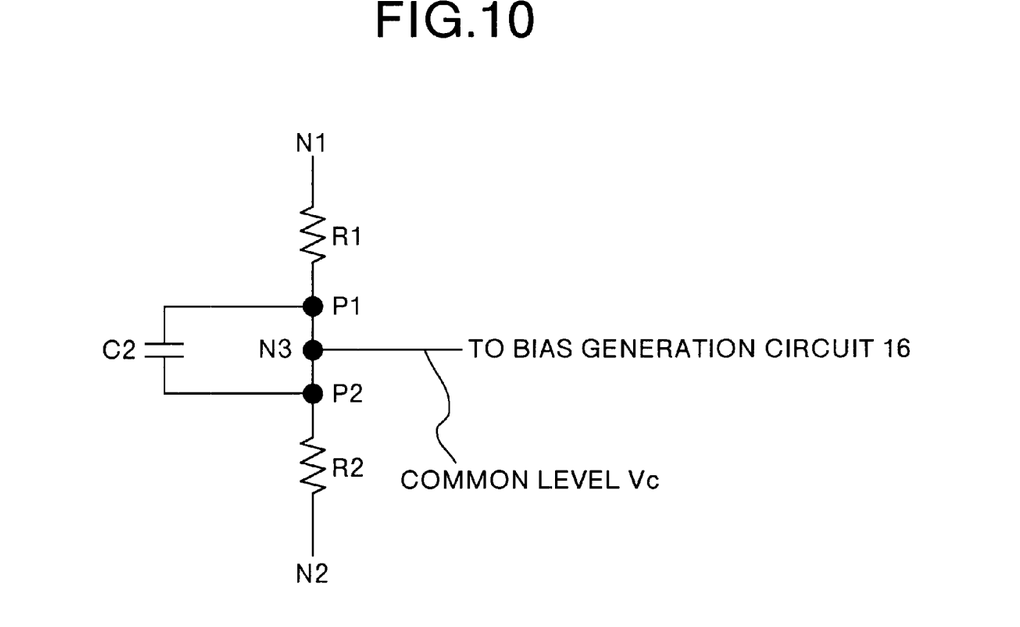
FIG. 10 is a circuit structure diagram showing a common level detection circuit 14 according to a sixth embodiment of the present invention.

FIG. 10 is a structure diagram showing still another example of the common level detection circuit 14 as a sixth embodiment of the present invention. The configuration is the same as the common level detection circuit shown in FIG. 4 with the difference that there is provided the capacitor C2 having both terminals connected to the node N3.

However, the terminals of the capacitor C2 are connected at different locations P1 and P2, with the node N3 in between them, on the wiring connecting between the resistors R1 and R2. The bias generation circuit 16 is provided with the output from the node N3.

The capacitor C2 prevents a common level detected by the common level detection circuit 14 from fluctuating due to noise included in input signals A and B.

Figure 11:
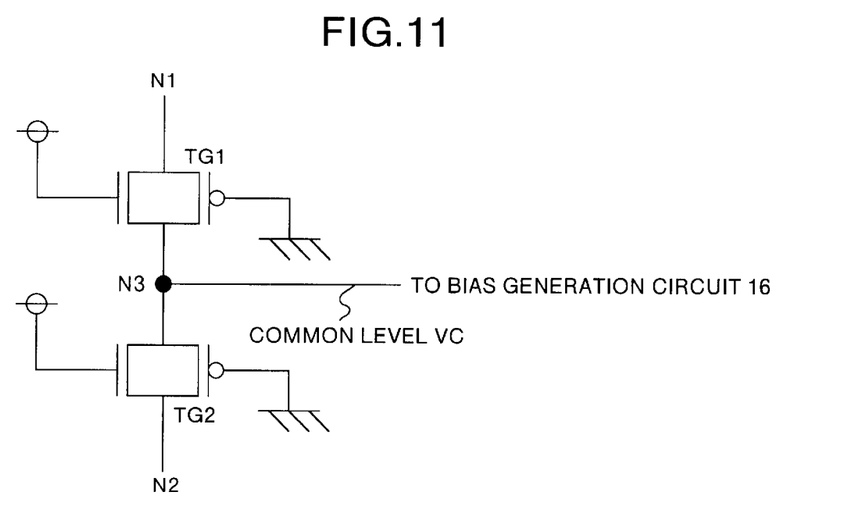
FIG. 11 is a circuit structure diagram showing a common level detection circuit 14 according to a seventh embodiment of the present invention.

FIG. 11 is a structure diagram showing still another example of a common level detection circuit 14 as a seventh embodiment of the present invention. The configuration is the same as the common level detection circuit shown in FIG. 4 with the difference that the resistors R1 and R2 are replaced with the transfer gates TG1 and TG2. In other words, the transfer gate TG1 is connected between the nodes N1 and N3, and the transfer gate TG2 is connected between nodes N2 and N3.

Each of the transfer gates TG1 and TG2 is structured by an nMOS transistor and a pMOS transistor that are connected in parallel. A power source voltage VDD is applied to a gate terminal of the nMOS transistor, and a ground voltage GND is applied to a gate terminal of the pMOS transistor.

The ON resistors of the transfer gates TG1 and TG2 are formed in the same structures. The ON resistors are matched with the impedance (wiring resistance of the transmission lines) of the transmission lines 5 and 6 shown in FIG. 2 respectively. These ON resistors function in a similar manner to that of the resistors R1 and R2 shown in FIG. 2 respectively.

Figure 12:
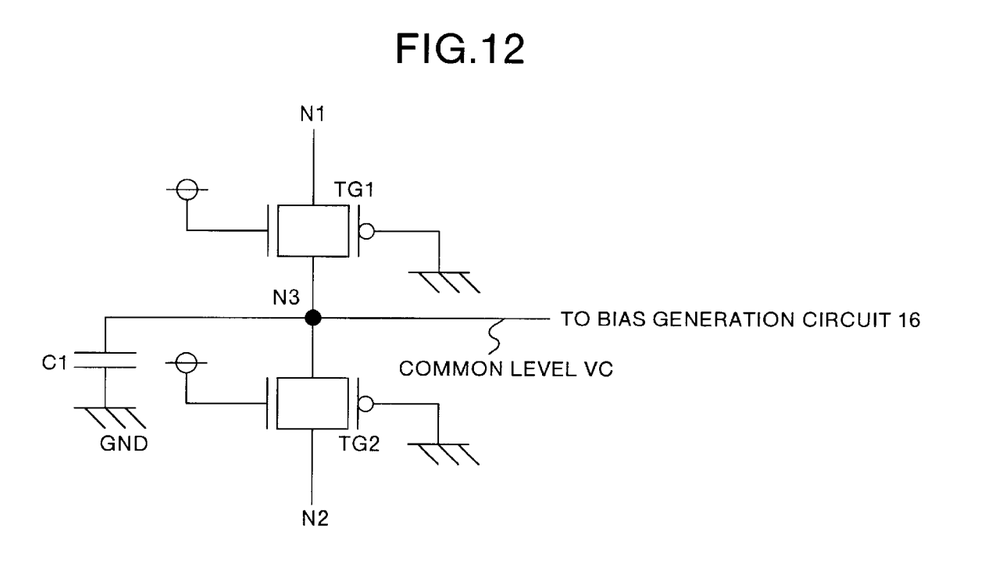
FIG. 12 is a circuit structure diagram showing a common level detection circuit 14 according to an eighth embodiment of the present invention.

FIG. 12 is a structure diagram showing still another example of a common level detection circuit 14 as an eighth embodiment according to the present invention. The configuration is the same as the common level detection circuit shown in FIG. 11 with the difference that there is provided the capacitor C1 having one terminal connected to the node N3 and the other terminal connected to the ground voltage GND.

The capacitor C1 prevents a common level detected by the common level detection circuit 14 from fluctuating due to noise included in input signals A and B.

Figure 13:
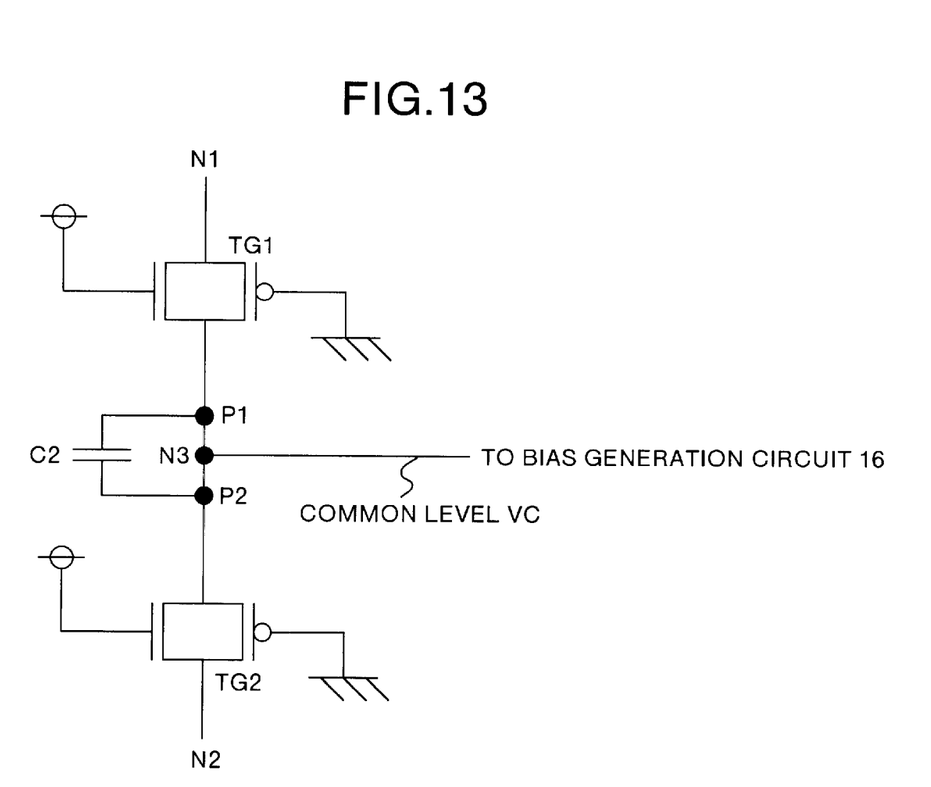
FIG. 13 is a circuit structure diagram showing a common level detection circuit 14 according to a ninth embodiment of the present invention.

FIG. 13 is a structure diagram showing still another example of a common level detection circuit 14 as an eighth embodiment according to the present invention. The configuration is the same as the common level detection circuit shown in FIG. 11 with the difference that there is provided the capacitor C2 having both terminals connected to the node N3.

However, the terminals of the capacitor C2 are connected at different locations P1 and P2, with the node N3 in between them, on the wiring connecting between the transfer gates TG1 and TG2. The bias generation circuit 16 is provided with the output from the node N3.

The capacitor C2 prevents a common level detected by the common level detection circuit 14 from fluctuating due to noise included in input signals A and B.

The capacitors C1 and C2 shown in any one of the FIG. 9 to FIG. 13 may be structured by a MOS transistor having a gate terminal as one terminal, and having a node having a source terminal and a drain terminal connected in common as the other terminal.

As explained above, according to the semiconductor integrated circuit of one aspect of the present invention, a current flowing through the third MOS transistor is adjusted according to a variation in the common level of input signals applied to the first and second nodes. The differential amplifier can amplify the input signals even when the common level has varied.

According to the semiconductor integrated circuit of another aspect of the present invention, variation in the common mode of the input signals applied to the first and second nodes can appear in the voltage at the third node. Further, when transmission lines are connected to the first and second nodes, the first and second elements function as terminating resistors of the transmission lines.

Furthermore, it is possible to restrict noise existing on the first and second nodes from influencing the third node.

Furthermore, it is possible to adjust an intermediate level of a signal output from the differential amplifier, by adjusting the value of the reference voltage.

Furthermore, it is possible to reduce the circuit scale by excluding the operation amplifier.

Moreover, the bias generation circuit can reduce power consumption, because it does not require a pair of differential amplifiers.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:
  a differential amplifier including a first MOS transistor having a gate terminal connected to a first node, a second MOS transistor having a gate terminal connected to a second node, and a third MOS transistor having a drain terminal connected to source terminals of the first and second MOS transistors respectively;
  a level detector circuit which detects an intermediate voltage level between voltages at the first and second nodes; and
  a bias generation circuit which generates a bias voltage to be applied to a gate terminal of the third MOS transistor in the differential amplifier based on the voltage level detected by the level detector circuit.

2. The semiconductor integrated circuit according to claim 1, wherein the bias generation circuit comprises:
  a second differential amplifier including a fourth MOS transistor having a gate terminal connected to an output of the level detector circuit, a fifth MOS transistor having a gate terminal connected to the output of the level detector circuit, and a sixth MOS transistor having a drain terminal connected to source terminals of the fourth and fifth MOS transistors respectively; and
  an operational amplifier which receives an output of the second differential amplifier and a reference voltage, and outputs a signal to gate terminals of the third and sixth MOS transistors.

3. The semiconductor integrated circuit according to claim 1, wherein the bias generation circuit comprises:
  a second differential amplifier including a fourth MOS transistor having a gate terminal connected to an output of the level detector circuit, a fifth MOS transistor having a gate terminal connected to the output of the level detector circuit, and a sixth MOS transistor having a drain terminal connected to source terminals of the fourth and fifth MOS transistors respectively,
  wherein the signal output from the second differential amplifier is input into gate terminals of the third and sixth MOS transistors.

4. The semiconductor integrated circuit according to claim 1, wherein the bias generation circuit comprises:
  a load element;
  a fourth MOS transistor having a gate terminal connected to an output of the level detector circuit, and a drain terminal connected to the load element;
  a fifth MOS transistor having a drain terminal connected to a source terminal of the fourth MOS transistor; and
  an operational amplifier which receives a signal output from the drain terminal of the fourth MOS transistor and a reference voltage, and outputs a signal to gate terminals of the third and fifth MOS transistors.

5. The semiconductor integrated circuit according to claim 1, wherein the bias generation circuit comprises:
  a load element;
  a fourth MOS transistor having a gate terminal connected to an output of the level detector circuit, and a drain terminal connected to the load element; and
  a fifth MOS transistor having a drain terminal connected to a source terminal of the fourth MOS transistor, wherein a signal output from the drain terminal of the fourth MOS transistor is commonly applied to gate terminals of the third and fifth MOS transistors.

6. A semiconductor integrated circuit comprising:

a differential amplifier including a first MOS transistor having a gate terminal connected to a first node, a second MOS transistor having a gate terminal connected to a second node, and a third MOS transistor having a drain terminal connected to source terminals of the first and second MOS transistors respectively;

a first element connected between the first node and a third node;

a second element connected between the second node and the third node; and a bias generation circuit which generates a bias voltage to be applied to a gate terminal of the third MOS transistor in the differential amplifier based on a voltage level at the third node.

7. The semiconductor integrated circuit according to claim 6, wherein the first and second elements are two resistor elements having the same resistance.

8. The semiconductor integrated circuit according to claim 6, wherein the first and second elements includes a p-channel type MOS transistor and an n-channel type MOS transistor connected in parallel.

9. The semiconductor integrated circuit according to claim 6 further comprising a capacitor connected to the third node.

10. The semiconductor integrated circuit according to claim 9, wherein the capacitor has two terminal, one terminal is connected to the third node, and the other terminal is applied with a fixed potential.

11. The semiconductor integrated circuit according to claim 9, wherein the capacitor has two terminal, both terminals of the capacitor are connected to two different points on a wiring that connects between the first and second elements, and the bias generation circuit is connected to separate points on the wiring located between the two points.

12. The semiconductor integrated circuit according to claim 6, wherein the bias generation circuit comprises:

a second differential amplifier including a fourth MOS transistor having a gate terminal connected to the third node, a fifth MOS transistor having agate terminal connected to the third node, and a sixth MOS transistor having a drain terminal connected to source terminals of the fourth and fifth MOS transistors respectively; and an operational amplifier which receives an output of the second differential amplifier and a reference voltage, and outputs a signal to gate terminals of the third and sixth MOS transistors.

13. The semiconductor integrated circuit according to claim 6, wherein the bias generation circuit comprises:

a second differential amplifier including a fourth MOS transistor having a gate terminal connected to the third node, a fifth MOS transistor having a gate terminal connected to the third node, and a sixth MOS transistor having a drain terminal connected to source terminals of the fourth and fifth MOS transistors respectively, wherein the signal output from the second differential amplifier is input into gate terminals of the third and sixth MOS transistors.

14. The semiconductor integrated circuit according to claim 6, wherein the bias generation circuit comprises:

a load element;

a fourth MOS transistor having a gate terminal connected to the third node, and a drain terminal connected to the load element;

a fifth MOS transistor having a drain terminal connected to a source terminal of the fourth MOS transistor; and an operational amplifier which receives a signal output from the drain terminal of the fourth MOS transistor and a reference voltage, and outputs a signal to gate terminals of the third and fifth MOS transistors.

15. The semiconductor integrated circuit according to claim 6, wherein the bias generation circuit comprises:

a load element;

a fourth MOS transistor having a gate terminal connected to the third node, and a drain terminal connected to the load element; and a fifth MOS transistor having a drain terminal connected to a source terminal of the fourth MOS transistor, wherein a signal output from the drain terminal of the fourth MOS transistor is commonly applied to gate terminals of the third and fifth MOS transistors.

* * * * *